United States Patent [19]
Smith et al.

[11] Patent Number: 5,702,662
[45] Date of Patent: Dec. 30, 1997

[54] PROCESS FOR ABLATING HIGH DENSITY VIAS IN FLEXIBLE SUBSTRATE

[75] Inventors: Adlai H. Smith, San Diego; Robert O. Hunter, Jr., Rancho Santa Fe; Bruce McArthur, San Diego; Steven Blair, San Diego; Jim Wilkinson, San Diego, all of Calif.

[73] Assignee: Litel Instruments, Inc., San Diego, Calif.

[21] Appl. No.: 536,863

[22] Filed: Sep. 29, 1995

[51] Int. Cl.$^6$ ............................................. B23K 26/00
[52] U.S. Cl. ........................... 264/400; 264/39; 264/101
[58] Field of Search ........................ 264/39, 101, 400; 219/121.68, 121.69, 121.76

[56] References Cited

U.S. PATENT DOCUMENTS

| | | | |
|---|---|---|---|
| 5,362,940 | 11/1994 | MacDonald et al. | 219/121.68 |
| 5,481,407 | 1/1996 | Smith et al. | 359/742 |
| 5,571,429 | 11/1996 | Smith et al. | 219/121.68 |

*Primary Examiner*—Leo B. Tentoni
*Attorney, Agent, or Firm*—Townsend and Townsend and Crew, LLP

[57] ABSTRACT

A apparatus and process for ablating a matrix of high density vias in a flexible substrate. The apparatus is cantilevered on a horizontal shelf from a partition where it can be rigidly supported. A vacuum container reciprocates towards and away from the partition and supports the horizontal shelf by permitting supporting casters to bear on and be supported by the reciprocating container. When the container is away from the partition, servicing of the apparatus as well as the insertion an removal of substrate can occur. When the container is adjoined to the partition, a vacuum can be drawn on the apparatus and processing commenced. A continuous flexible substrate is provided extending in a circuitous path between a supply roll and a take up roll, all interior of the container. The flexible substrate is maintained under constant tension and incrementally advanced. The substrate is incrementally advanced and stopped, passing across a table. When the roll is advanced, the table releases the substrate and is cleaned of the debris resulting form previous ablations. When the roll is stopped, the table clamps and precisely levels the substrate for sequential ablation of the substrate.

6 Claims, 11 Drawing Sheets

PROCESS FOR ABLATING HIGH DENSITY VIAS IN FLEXIBLE SUBSTRATE

This invention relates to the phase mask machining of thin flexible laminates with high density regular patterns of vias. Specifically, an apparatus and process for such high density phase mask machining is disclosed.

BACKGROUND OF THE INVENTION

Phase mask machining is known. Specifically, coherent light scans a mask. The mask is provided with transparent or reflective patterns in the form of computer generated holograms which alter the phase and amplitude of the coherent light incident upon the mask. The patterns project working images to a workpiece or substrate which is "machined" by ablation, typically by the placement of apertures such as vias through the workpiece.

In MacDonald et al. U.S. Pat. No. 5,362,940 entitled Use of Fresnel Zone Plates for Material Processing issued Nov. 8, 1994, phase mask machining was disclosed utilizing so-call subapertures. In this patent, each subaperture contained its own image information typically exclusive of the remaining subapertures.

In the above patent, each subaperture contains at least two subsections of optical information. First, the subaperture contains convergence information. The coherent light when scanning the subaperture comes to focus at a working distance from the mask. This function can be referred to as focus or convergence and usually takes the concentration of the scanning light from an intensity where no ablation will occur to a substrate to an intensity where ablation can occur at the substrate.

Second, the subaperture contains image information. Specifically, and by constructively and destructively interfering the amplitude and phase of the rays of coherent light, a working image of tailored intensity can be generated by the subaperture. By way of example, we have constructed working images of designed intensity profile which can ablate apertures of specific shape for the generation of ink jet nozzles.

In the phase mask machining of optical substrates, it is frequently desired to place a repetitive patterns, for example rows and columns of vias, onto a substrate. In many applications, the size of the substrates which are required to be patterned or machined exceeds by many times the size of the area of the mask that can be directly written by a conventional E-beam.

In the fabrication of masks using conventional E-beams, extremely fine resolution patterns for computer generated holograms (CGHs) are written to small areas—usually less than 5 inches by 5 inches. It is common that such small areas must be written in relatively long periods of time. Even with accelerated techniques of mask writing, it is not uncommon for masks having 50 to 500 million (and up to one billion) features to be written in periods of time exceeding $8_1$–hours with an E-beam.

We have pioneered phase mask machining. We have discovered that it is desirable to process large substrates with high densities of features such as rows and columns of vias. In this processing, two requirements must be met.

First, the features produced on the substrate should have the highest possible density.

Second, the features produced over a large area should be precisely located with respect to one another.

APPLICATIONS NOT PRIOR ART

In an application Ser. No. 08,536,583, filed simultaneously herewith on Sep. 29, 1995 and incorporated herein by reference, entitled Large Precision Masks for Phase Mask Machining, now pending we disclose a large phase mask for phase mask machining. This mask, which is either of composite or monolithic construction, has a large area precisely configured with optical features for the patterned ablation of substrates below the mask. The large area mask has the advantage of enabling the maximum density of features such as vias and having these features precisely located one with respect to another.

In scanning large area plates it is necessary to "stabilize" the scanning coherent light. Since the optical features on the mask are precisely located one with respect to another, the same registration is desired when the optical features are projected as working images for the ablation of a substrate. This requires that the beam in scanning one part of the large phase mask be parallel to the same beam when scanning all other portions of a large phase mask. If the beam deviates from parallel as it scans from one portion of the large mask to other portions of the large mask, the underlying and ablated working images will likewise deviate from their intended alignment. Additionally, such deviation can change the angularity of the coherent light between the mask and the workpiece. This causes the working image produced by the subaperture to deviate from its intended position. The intended ablation at the workpiece is degraded.

In prior scanning arrangements, it has been possible to achieve parallel transport of projected coherent light beams (usually laser generated) utilizing air bearing supported stages. In the ablation of large area substrates, the use of a vacuum has been found preferable. Unfortunately, air bearings cannot be used in such a vacuum; the air from the bearing operates to destroy the vacuum.

In patent application Ser. No. 08/537,079, filed simultaneously herewith on Sep. 29, 1995 and incorporated herein by reference, entitled Stabilization of Parallel Transport Mirror System, now, pending we set forth the solution to this problem. Specifically, a beam scanning system and attached system of beam stabilization is utilized for ensuring the parallel transport of an orthogonally deflected coherent light beam scanned in normal incidence over a planar large area phase mask. A first scanning stage with right angle reflecting mirror scans the beam in the X-direction and reflects the scanned beam to the Y-direction. A second scanning stage with right angle reflecting mirror is mounted to the first scanning stage. This second scanning stage deflects the scanning beam in the Y-direction and reflects the beam downward through the large area mask and onto the workpiece. The scanning beam has divided out a small portion thereof as a reference beam. This reference beam is then diverted to precisely opposite orthogonal paths to the incidence of the scanning beam. A first reference stage with right angle reflecting mirror scans the beam opposite to the X-direction of the scanning beam and reflects the reference beam opposite to the Y-direction of the scanning beam. A second reference stage with right angle reflecting mirror is mounted to the first scanning stage. This second reference stage deflects the scanning beam opposite to the Y-direction and reflects the beam upward opposite to Z direction of incidence through the large area mask. After upward deflection, the beam is reflected at an optical flat and retro-directed oppositely through the reference path. After retracing the orthogonal reference legs, the beam is diverted to a quad detector. Beam excursion at the quad detector measures departure from true parallel transport to produce a signal for driving a single steerable mirror in 2-axis angular deflection on incidence to the scanning system. An alternate but not preferred embodiment is disclosed utilizing reflection of a portion of the incident scanning beam with reflection preferably at the large area phase mask. Use of an independent reference beam is also disclosed.

This disclosure relates to the resultant tool utilizing the above disclosures in combination. A new tool is generated which is capable of ablating large quantities of substrate with high density apertures in the order of one million vias per square foot of material.

A related patent application is entitled Apparatus and Process for Using Fresnel Zone Plate Array for Processing Materials, Ser. No. 08/121,060 filed 14 Sep. 1993, now U.S. Pat. No. 5,481,407 issued Jan. 2, 1996. Similarly, another related patent application is entitled Apparatus and Process for Highspeed Laminate Processing with Computer Generated Holograms, Ser. No. 08/201,600 filed Feb. 2, 1994, now U.S. Pat. No. 5,571,429 issued Nov. 6, 1996. In this latter disclosure, ablation occurs in a vacuum environment.

DISCOVERY

In producing the tool of this invention, we have made several discoveries. Since we are the pioneers of this type of ablation, and since the prior art does not discuss or consider the difficulties we set forth here, invention is claimed in recognizing these difficulties as well as designing apparatus for overcoming these difficulties.

First, it is desirable to process the substrate in a vacuum. If the substrate is not processed within a vacuum, oxidation of the polyimide occurs and hydrocarbons are formed. This occurs in the form of soot. Where a vacuum is not utilized, the accumulated soot does not travel far and is immediate to the table and the substrate being processed. This soot lands on the substrate being processed. Further, it lands on and adheres to surfaces on which the substrate is processed. This can cause the material being processed to be out of registration with the produced working images. Further, as the material is incrementally advanced, it is scratched.

Secondly, and since it is highly desirable to process the material in a vacuum, the question has arisen of the possibility of placing a window immediate overlying the substrate to be ablated. This course has been rejected. Specifically, large windows inevitably accumulate artifacts. These artifacts become repeatable with respect the substrate as it is processed, generating repeatable defects in the repeating patterns of the substrate. Therefore, a beam generated outside of the vacuum is scanned inside the vacuum so that artifacts are not repeatably generated on produced product.

Third, throughput of the invention is extremely important. We have therefore determined to utilize side-by-side beams. These side-by-side beams when both operational increase throughput; when only one beam is operational, total loss of production capacity of the machine does not occur, it runs at roughly half speed. Provision can be made for operation of the disclosed apparatus with one laser.

Fourth, heating in the vicinity of the ablated substrate cannot be tolerated. Unfortunately, the ablative process generates heat. Specifically, we have found heating to cause distortion of the substrate. This distorts the regular ablated matrix of vias that we are trying to achieve. Further, the distorted laminate can move from its position of precise support on the table.

Finally, and since the entire apparatus and process must be carried out internally of a vacuum, provision must be made for the convenient support of the apparatus within a vacuum container. At the same time, access for servicing of the equipment and suitable adjustment of the optics is required.

SUMMARY OF THE INVENTION

A apparatus and process for is disclosed for ablating a matrix of high density vias in a flexible substrate. The apparatus is cantilevered on a horizontal shelf from a partition where it can be rigidly supported. A vacuum container reciprocates towards and away from the partition and supports the horizontal shelf by permitting supporting casters to bear on and be supported by the reciprocating container. When the container is away from the partition, servicing of the apparatus as well as the insertion and removal of substrate can occur. When the container is adjoined to the partition, a vacuum can be drawn on the apparatus and processing commenced.

A continuous flexible substrate is provided extending in a circuitous path between a supply roll and a take up roll, all interior of the container. The flexible substrate is maintained under constant tension and incrementally advanced. The substrate is incrementally advanced and stopped, passing across a table. When the roll is advanced, the table releases the substrate and is cleaned of the debris resulting from previous ablations. When the roll is stopped, the table clamps and precisely levels the substrate for sequential ablation.

Windows in the vacuum vessel permit the entry of the externally generated laser radiation outside of the vacuum to internal scanning apparatus within the vacuum for permitting ablation of the substrate. A holographic mask is provided having a multiplicity of holographic subapertures is provided immediately overlying the substrate. The mask is serially scanned by coherent light across the subapertures. The subapertures when scanned produce at a working distance from the mask an array of working images. The array of working images ablates a corresponding array of vias in the substrate. By repeated sequential advance and ablation, entire rolls of substrate can be provided with high density matrices of vias.

An advantage of the disclosed process is that radiation incident on the substrate which is not focused to ablating intensity has the tertiary effect of cleaning the substrate and table of accumulated debris.

A further advantage of the apparatus is that considerable material can be process once a vacuum is drawn. Specifically, continuous processing of substrate for a period of several hours can occur.

DESCRIPTION OF THE PREFERRED EMBODIMENT

Figure 1A:
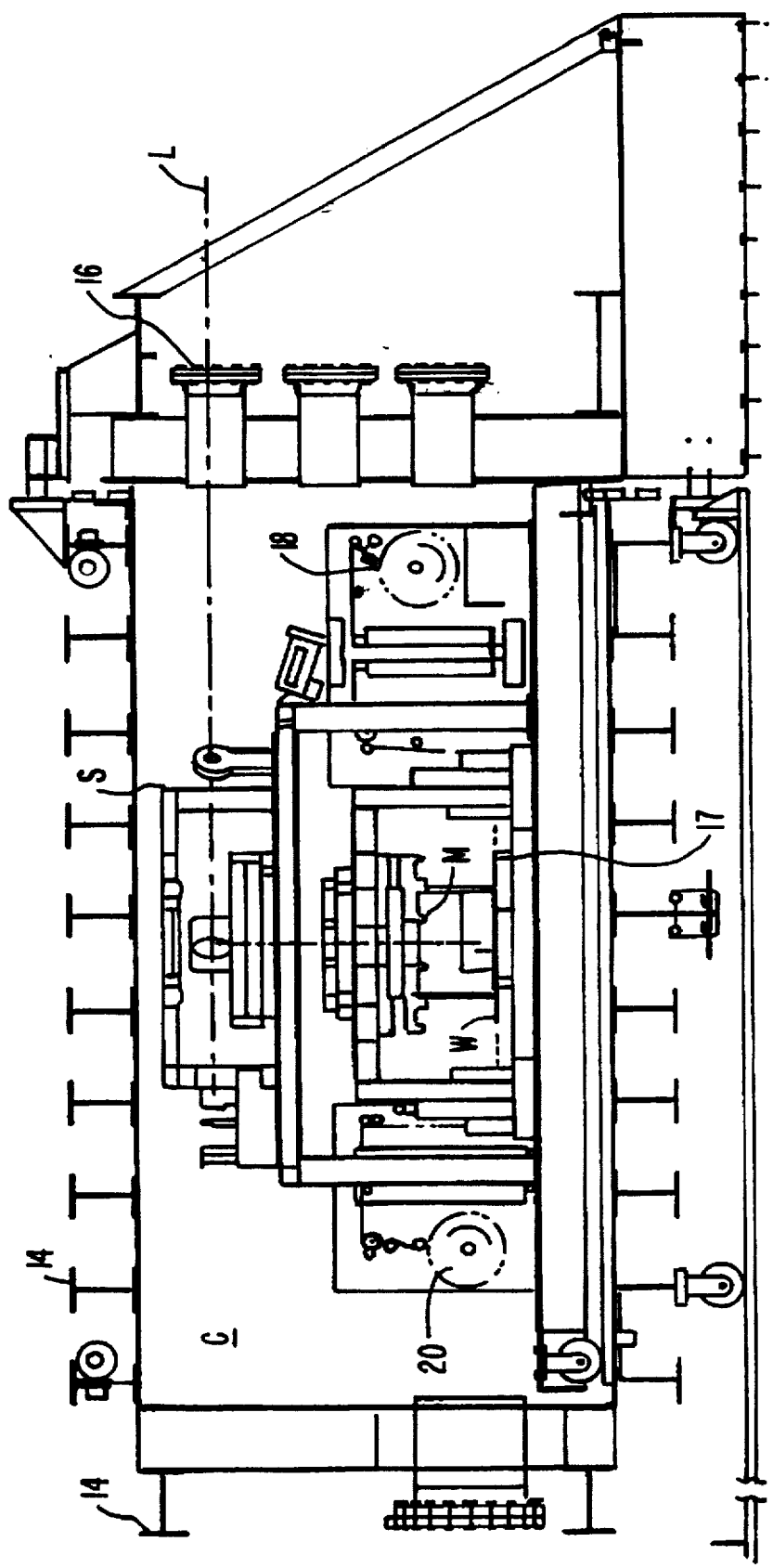
FIGS. 1A, and 1B are a side elevation, and a reduced end elevation of a vacuum contained machine for successively advancing web sections and phase mask machining those web sections to produce high density optically ablated features.
Figure 1B:
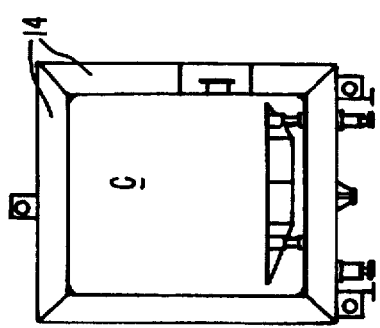

Referring to FIGS. 1A and 1B, vacuum chamber C is shown reinforced by steel beams 14. Internal of vacuum chamber C, there is provided scanning table S, large mask M, and workpiece W.

Overall operation can be simply described. Coherent light L passes through chamber window 16 to scanning table S. At scanning table S, coherent light L is deflected downward and scanned through and across large mask M. During scanning, large mask M forms a matrix of ablating images in workpiece W.

In the case of the present disclosure, workpiece W constitutes flexible thin film 17 advanced from supply roll 18 to take up roll 20. Advance is conventional and consists of incremental and discrete twelve inch advances so that large mask M scanned by coherent light L can scan flexible thin film 17 in one square foot sections to place in the thin film a matrix of ablated vias (or holes). It will be noted that the path of flexible thin film 17 is serpentine; this type of path is conventional and adjusted to both the material being processed and the particular material by standards well understood in the prior art.

It will be observed that the entire apparatus for incrementally advancing flexible thin film 17 is here placed within a vacuum. It will be understood that the stabilizer of this invention could work equally well with flexible thin film 17 ablation where the film has a vacuum only placed locally over the film section being ablated. This, however, is not preferred for several reasons.

First, a local window through which the beam would have to be disposed immediately over flexible thin film 17. This window would have to be at least as large as large mask M. Such windows are expensive and would over time accumulate optical artifacts. The result of these artifacts would be repeated on the processed product.

Figure 2:
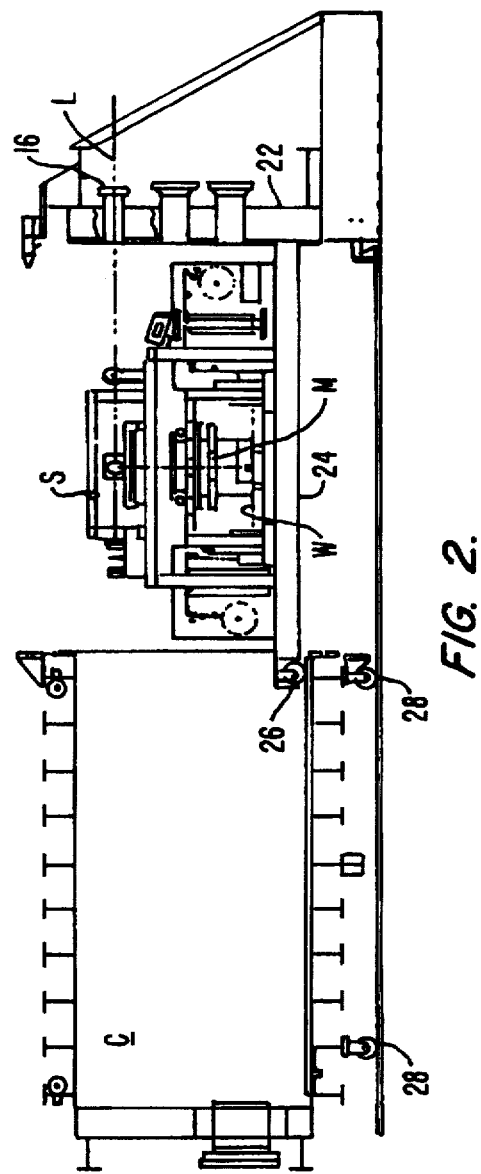
FIG. 2 is a side elevation section similar to FIG. 1A illustrating the machine for successively advancing web sections withdrawn from the vacuum chamber.

Referring to FIG. 2, opening of vacuum chamber C is illustrated either for servicing of the apparatus such as withdrawal of processed flexible thin film 17 and insertion of unprocessed flexible thin film 17. Specifically, vacuum chamber C includes fixed end wall 22. Fixed end wall 22 includes cantilevered platform 24 with outer rollers 26. Likewise, vacuum chamber C is supported on chamber support rollers 28. Once vacuum is broken, vacuum chamber C is rolled outward exposing scanning table S, large mask M, and workpiece W to atmosphere. With vacuum chamber C, it supports outer rollers 26 and thus assists in supporting cantilevered platform 24. It will additionally be noted that during such opening, scanning table S, large mask M, and workpiece W all remain fixed with respect to fixed end wall 22 and coherent light L through chamber window 16. Thus, and when vacuum chamber C is open, alignments of coherent light L with respect to scanning table S, large mask M, and workpiece W can easily be made.

Figure 3:
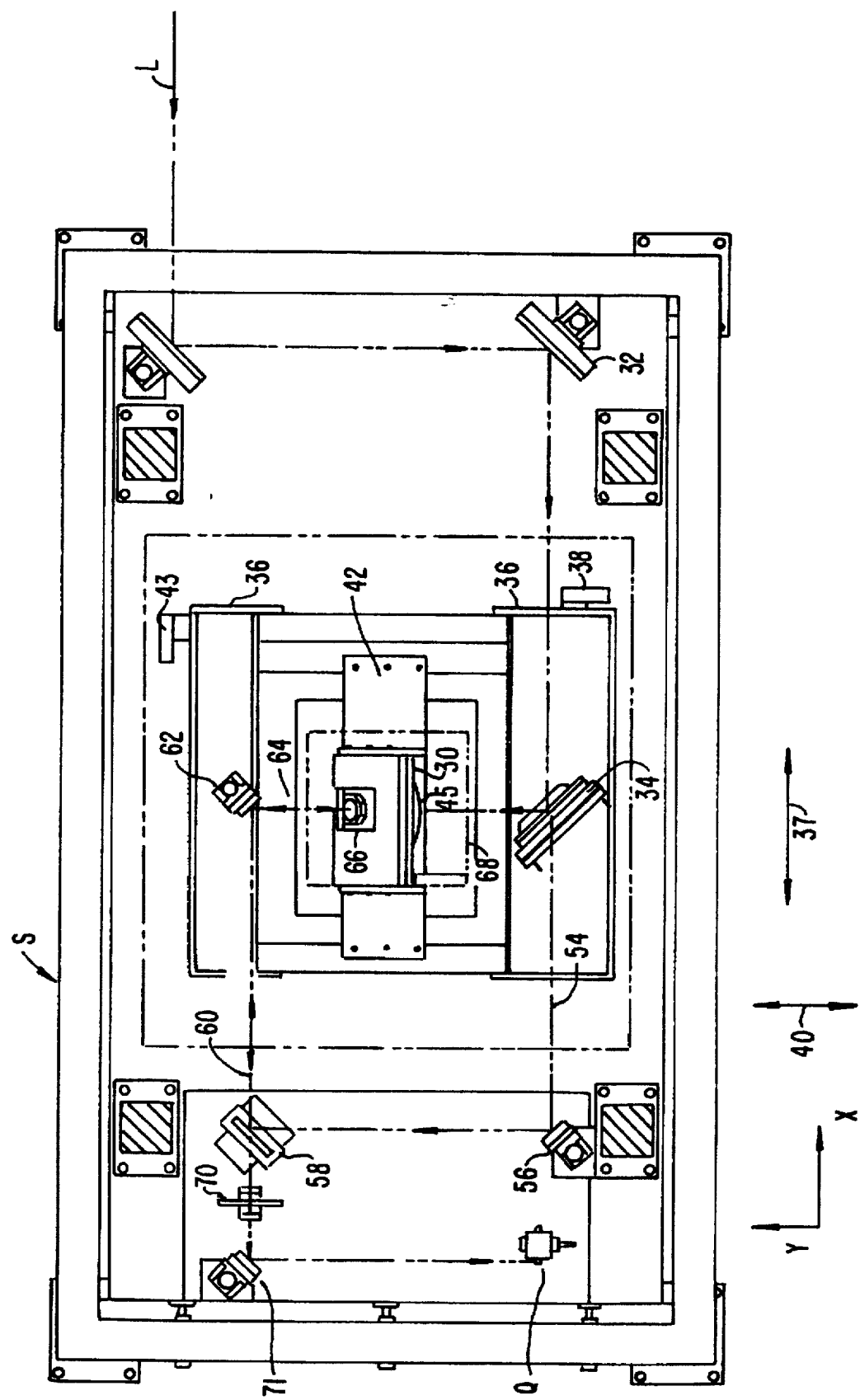
FIG. 3 is a plan view of the beam scanning system of this invention illustrating the scanning motion of the stabilized beam system with the scanning beam scanning vertically downward and the reference beam scanning vertically upward.

Referring to FIG. 3, a plan view of scanning table S is illustrated. Coherent light L enters through chamber window 16 (not shown) and eventually to steerable mirror 30. As will be understood more fully, steerable mirror 30 is driven responsive to deviations from vertical of coherent light L as it leaves scanning table S. Steerable mirror 30 is driven to cause movement of coherent light L equal and opposite to any vertical misalignment produced during scanning. By such equal and opposite movement to departures from vertical during scanning of coherent light L, exact parallel transport of coherent light L occurs at all positions of scan on large mask M.

In the following discussion, the function of scanning table S will first be described. Thereafter, stabilization of the scanned beam with respect to vertical will be set forth.

Regarding scanning of the beam, in incidence through large mask M, coherent light L passes to X-direction reflecting mirror 32, causing the light to pass parallel to the X-direction of scan. Thereafter, coherent light L is incident on Y-direction reflecting mirror 34. Stopping here, scan in the X-direction can be understood.

Scanning table S is driven at first stage 36 by motor 38 along X-direction 37. Thus the point at which Y-direction reflecting mirror 34 deflects to the Y-direction 40 causes X-direction 37 scan of coherent light L.

Scanning in Y-direction 40 is analogous.

Scanning table S is driven at second stage 42 by motor 43 in Y-direction 40. This second stage 42 is supported on first stage 36. It therefore moves in the X direction whenever stage 36 so moves. It has mounted thereto Z-deflection mirror 45. Z-deflection 45 is the same as stabilizing mirror 30. This Z-deflection mirror 45 causes light to be incident straight down on large mask M. The position that Z-deflection mirror 45 occupies for this downward deflection of coherent light L determines the Y-position on large mask M.

Figure 5:
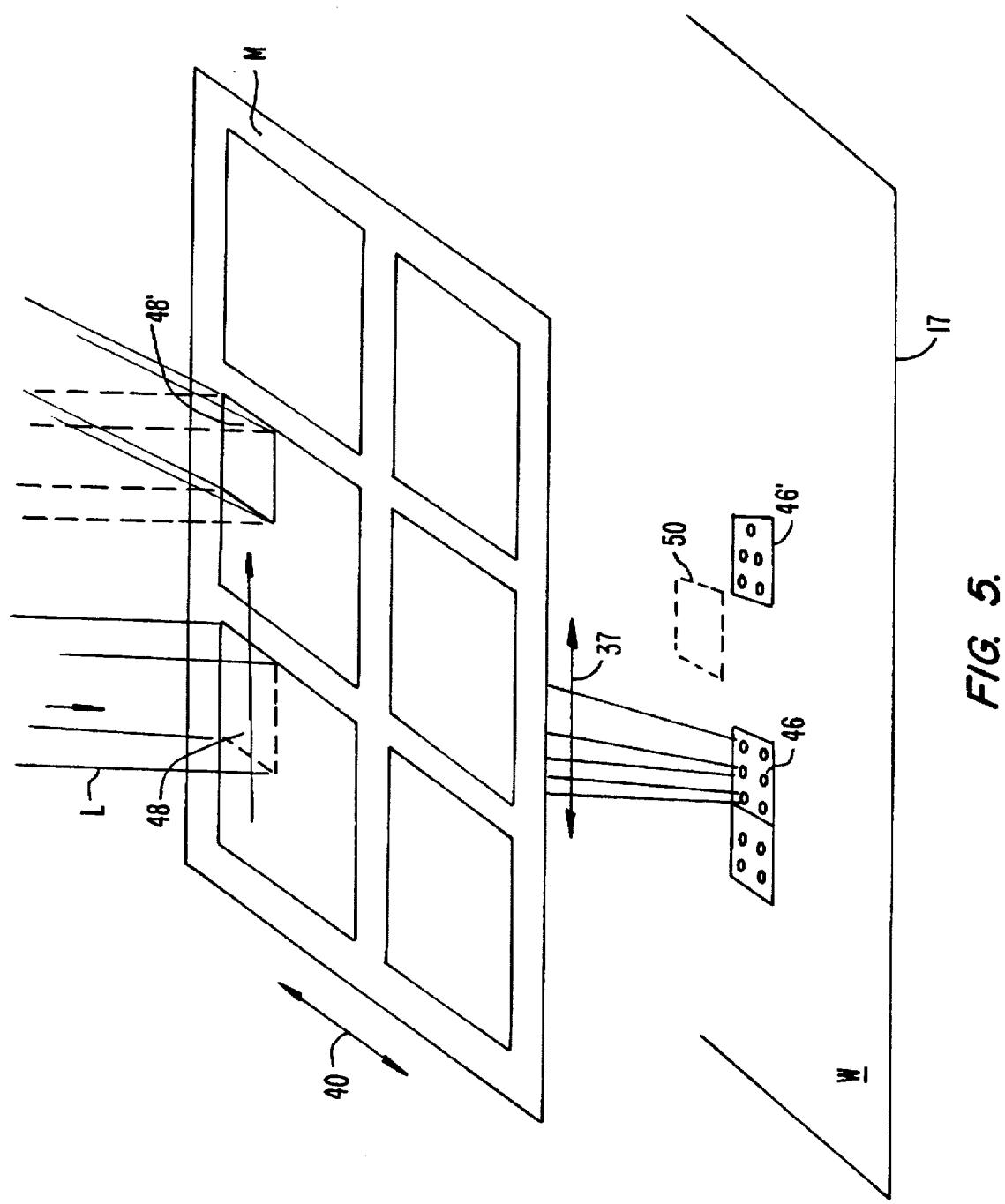
FIG. 5 is a perspective view of the large area phase mask and workpiece for ablating the webbing with high density images.

Having set forth the scanning path, reference can now be made to FIG. 5. In this figure, the production of flexible thin film 17 workpiece W with matrix of vias 46. Coherent light L scans large mask M in X-direction 37 and Y-direction 40. In such scan it passes over discrete subaperture section 48 of large mask M. Presuming verticality, it will produce matrix of vias 46 under discrete subaperture section 48.

Now presume that coherent light L has moved on in scan to discrete subaperture section 48'. However, and since the respective first stage 36 and second stage 42 are roller bearing supported, slight variance in the incidence of coherent light L on large mask M has occurred. As illustrated, the light has departed from true vertical. Two effects occur.

First, instead of producing matrix of vias 46' in precise alignment with previous matrix of vias 46, displacement occurs. Transfer of matrix of vias to misalignment location 50' occurs.

Second, the so-called "working distance" for the discrete apertures will change. Presuming that this distance increases, the actual working images produced may be other than precisely aligned with workpiece W.

It will be understood that FIG. 5 illustrates the problem in an expanded format. Understanding the true scale and total magnitude of vias is important. Since in a typical area of one square foot it is contemplated that one million vias will be located, density of the vias is extremely high. Further, and for many features to be configured on such substrates, precision of alignment of the vias with respect to one another is required. Where vias or groups of vias are out of alignment, unacceptable irregularity of the produced substrate occurs. By way of example, misalignment location 50 represents such a case. Accordingly, it will be understood that it is necessary to stabilize coherent light L as it scans large mask M.

In many cases it has been possible to use air bearing stages. Such stages have sufficient precision to allow acceptable parallel transport of coherent light L. However, the reader will understand that the stabilization scheme here utilized will also assist such air bearing stages from having improper alignment to misalignment location 50.

Unfortunately, air bearing stages cannot be considered within vacuum chamber C. Leakage from such air bearing stages would destroy the vacuum that vacuum chamber C creates. This being the case, the respective scanning table S at first stage 36 and second stage 42 have to be mounted on roller or other mechanical contact bearing.

We have discovered in the analysis of such mechanical bearing mounts that only gradual misalignment occurs as a function of scanner position. Such misalignment when graphed with respect to scanning displacement produces a gradual angular misalignment of scanning beam L. This being the case, stabilization of coherent light L can easily occur. What is needed, is a scheme of determining the misalignment from a reference path and deriving from the determined misalignment at the reference path the required correction of the scanning path. Input of that determined correction could then occur to steerable mirror 30.

Figure 4:
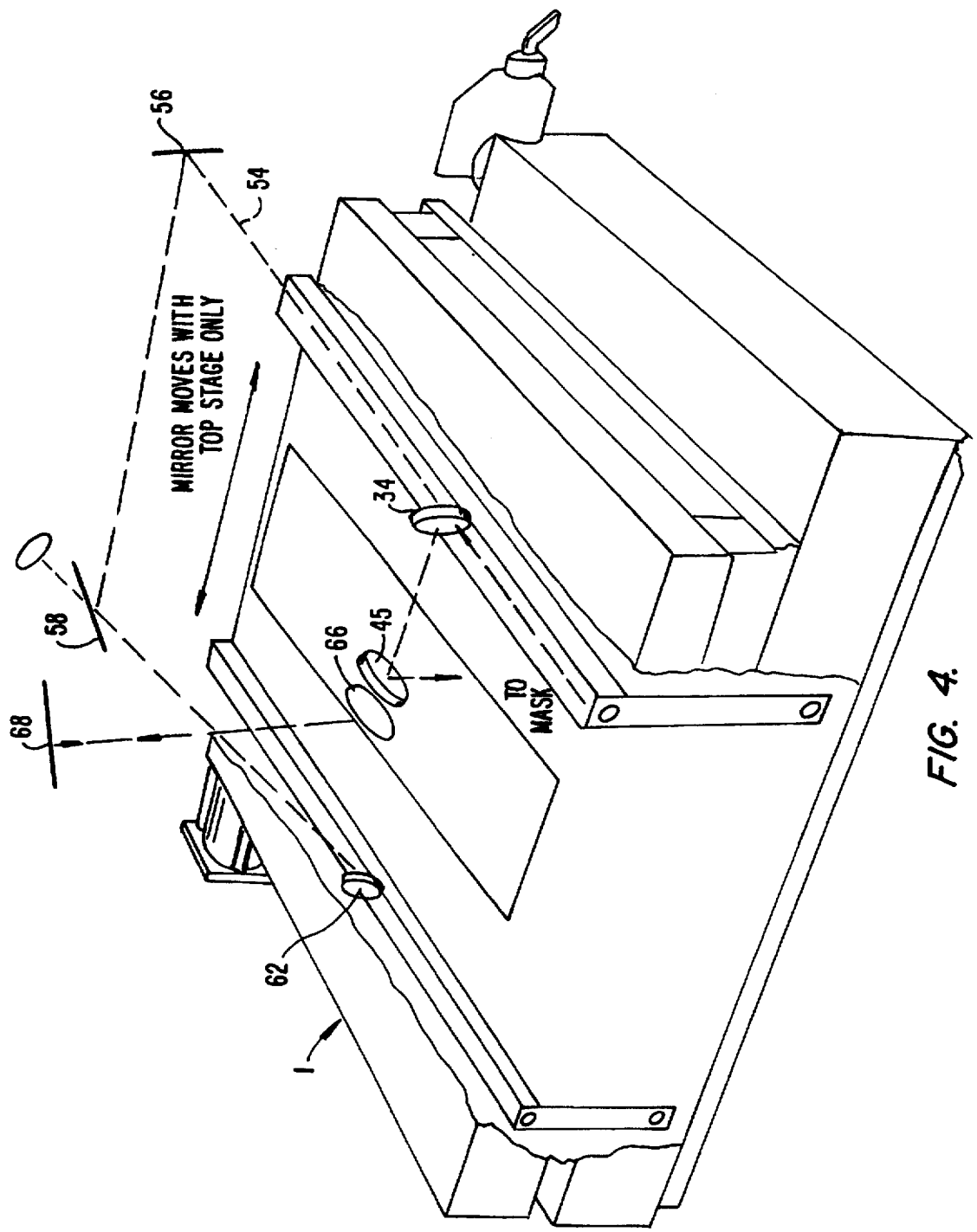
FIG. 4 is a perspective view of the scanning path and the reference beam path for effecting stabilization of the scanning beam in passing through a large area phase mask for ablating high density features on the successively advanced web.

With respect to FIG. 3 and 4, the reference path can easily be understood. First, Y-direction reflecting mirror 34 has slight beam splitting transparency. It passes reference beam 54 to first reference deflecting mirror 56 and then to reference beam splitter 58. The sum deflection of first reference deflecting mirror 56 and reference beam splitter 58 is to cause reference beam 54 at X-direction reference path 60 to proceed opposite to and parallel to scanning coherent light L from X-direction reflecting mirror 32.

This reference beam 54 then proceeds to second reference deflecting mirror 62 where deflection to Y-direction reference path 64 occurs. Again, this path is opposite to and parallel to scanning coherent light L from Y-direction reflecting mirror 34.

Finally, reference beam 54 is incident upon Z-deflection reference mirror 66. Deflection at Z-deflection reference mirror 66 causes light to be deflected upwardly opposite to and parallel to light from Z-deflection mirror 45.

Thus, the incidence of the reference path of reference beam 54 is understood.

Reference beam 54 is incident to optical flat mirror 68 mounted to scanning table S and independent of respective first stage 36 and second stage 42. Reflection of reference beam 54 occurs.

Reflection occurs to Z-deflection reference mirror 66, Y-direction reference path 64, second reference deflecting mirror 62, X-direction reference path 60 with incidence to first reference beam splitter 58. Like Y-direction reflecting mirror 34, second reference deflecting mirror 58 is partially transparent. It passes light to quad detector Q.

Figure 7:
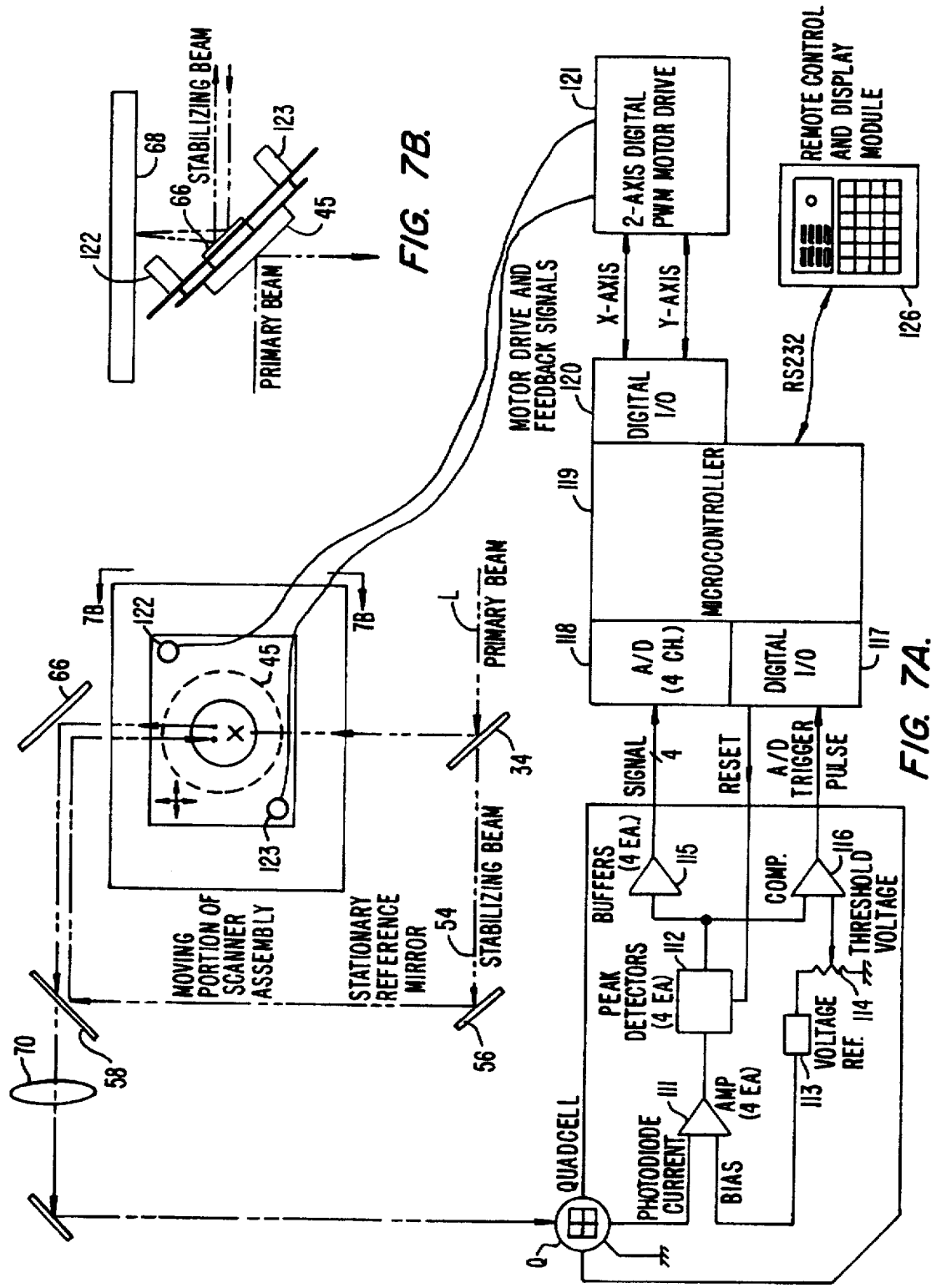
FIGS. 7a, 7b are electrical schematics of a circuit for driving the steerable mirror to maintain parallel transport in all positions of scan over large area phase mask.

Stopping here, and presuming the misalignment previously alluded to in FIG. 5, it will be understood that reference beam 54 upon incidence to quad detector Q will undergo excursion. That excursion can be turned into a signal to drive steerable mirror 30. This can best be understood with reference to FIG. 7.

Coherent light L enters system and is split by Y-direction reflecting mirror 34. The minor portion of the beam that passes through Y-direction reflecting mirror 34 is used only for scanner stage stabilization and is referred to as reference beam 54. This reference beam 54 reflects off mirror first reference deflecting mirror 56 and first reference beam splitter 58. Reference beam 54 then reflects off Z-deflection reference mirror 66 which is parallel and physically linked with Z-deflection mirror 45 (see FIGS. 3 and 4).

Upward deflection to optical flat mirror 68 occurs. No matter where scanning table S is in its range of motion, reference beam 54 reflects off optical flat mirror 68 back through first reference beam splitter 58 through quad detector focusing lens 70, deflection mirror 71 and finally quad detector Q.

Quad detector Q is reverse biased by voltage reference 113 and operates in the photoconductive mode. Photodiode currents are four in number from the quad detector, with only one of the four circuits being illustrated here. These photodiode currents pass through transimpedance amplifiers 111 which both amplify and convert the photodiode currents to voltage levels. The peak voltage level attained during the laser pulse is captured by peak detector 112 and buffered at buffers 115 for acquisition by A/D converter 118. The voltage from one of the 4 peak detectors must be of sufficient amplitude to exceed the threshold voltage set by potentiometer 114 which allows comparator 116 to switch states. The output of this comparator is used to interrupt microcontroller 119 which initiates A/D conversions on the 4 buffered quad detector signals. Immediately after the 4 quad detector signals have been acquired a reset pulse is generated via digital I/O 117. The reset pulse resets all 4 peak detectors 112 simultaneously by making them ready for the next laser pulse.

The acquired quad detector signals are used to generate normalized directional error terms for the X and Y axes. These signal errors are digitally low pass filtered and converted by a constant to a target value in encoder counts. The difference between the target encoder count and the present encoder count is the error term for a PID control loop that generates with pulse width values. The pulse widths are fed to a 2-axis digital PWM motor driver 121 via digital I/O 120. The motors 122 and 123 control the motion of the physically linked scanner mirror 124 and steerable mirror 30. The error terms are generated in such fashion as to always steer the stabilizing beam back to the center of the quad detector, thus correcting for roll and pitch in the scanner stage motion. When the stabilizing beam is perfectly centered, the signal errors are zero and the pulse widths sent to the motor driver are zero.

System alignment is manual mode and adjustments to PID parameters can be made through the remote control and display module 126. This portable device can be placed in the immediate vicinity of the optics to allow the user to both tune and monitor system performance.

Figure 6:
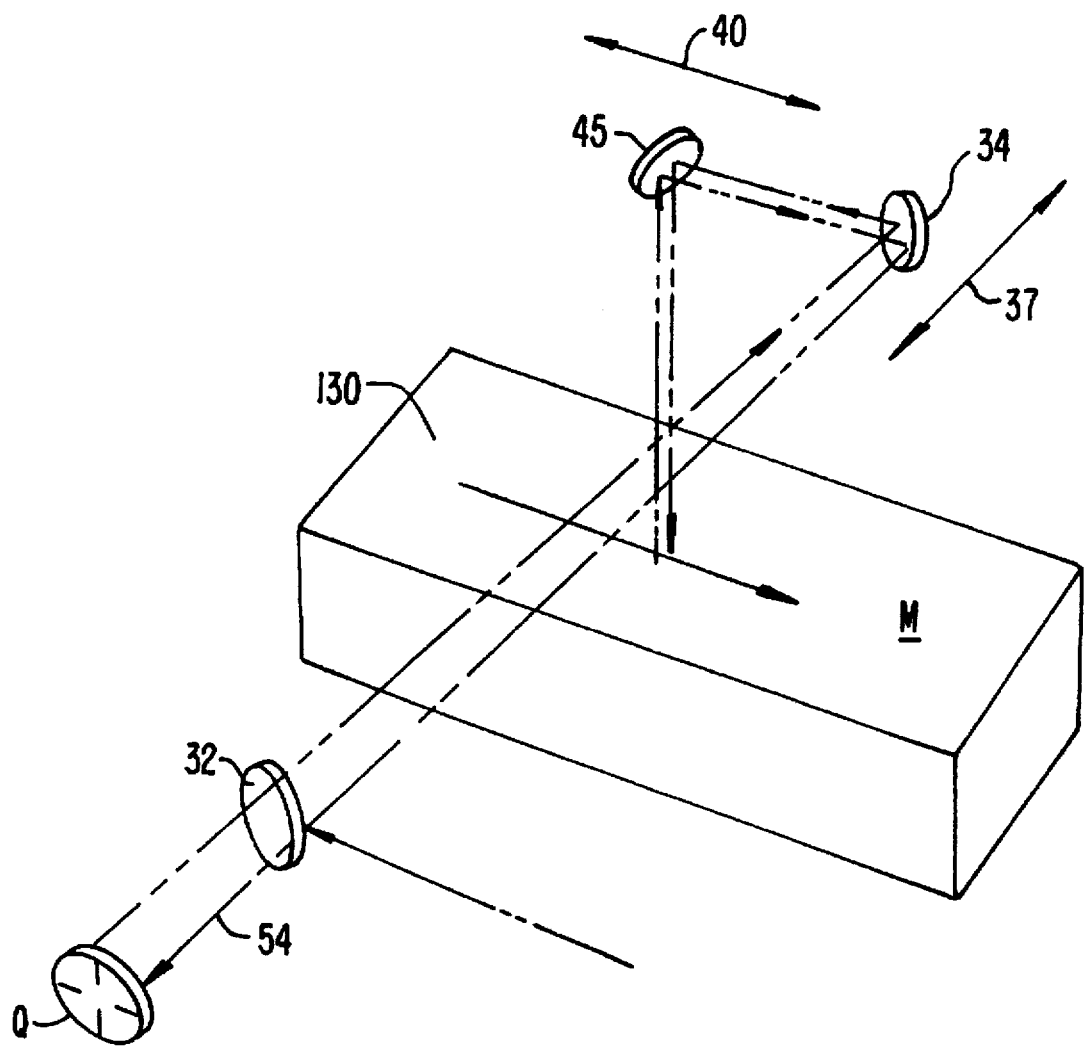
FIG. 6 is a schematic of an alternate embodiment illustrating the alternate scheme of stabilization.

With reference to FIG. 6, it should be understood that vertical stabilization can be achieved utilizing light reflected from large mask M. In such a device, the incident and upper surface 130 of large mask M would be made reflective to at least a portion of the light incident upon large mask M. Fresnel reflection from an uncoated mask surface is the typical reflection mechanism. Thereafter, reflection through the scanning optical train of scanning table S would occur with a beam splitter and quad detector Q effecting stabilization. In such a case, a mirror such as X-direction reflecting mirror 32 would be the site for the beam splitter and an appropriate quad detector Q would be used behind X-direction reflecting mirror 32.

Alternately, reference beam 54 could be generated by an additional laser source. For example, reference beam 54 could be independently generated by a helium-neon laser. The reference laser and stabilized beam would be initially (before going onto scanning table S) moving in the same direction or at least in fixed directions relative to one another. While the detecting circuitry after quad cell Q would be somewhat different, the arrangement and disposition of optical elements would be the same. The detecting and processing electronics is somewhat simpler and a HeNe or other CW laser is desirable, in fact preferable.

Figure 8:
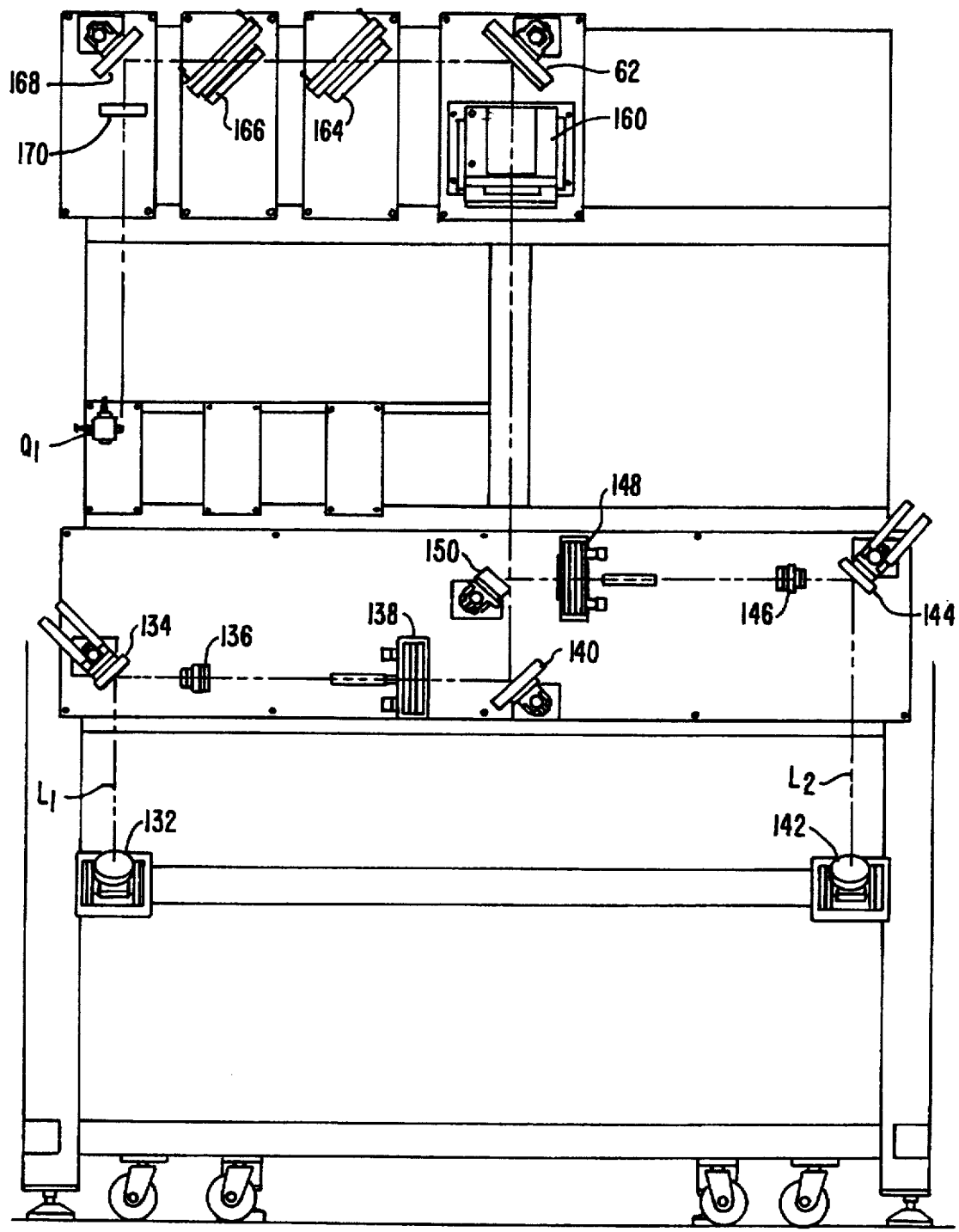
FIG. 8 is a side elevation view of the scanning table of this invention adapted for the parallel transport of two side-by-side beams from paired and alternating lasers being processed by the scanner.

Referring to FIG. 8, optical panel P is shown. Coherent light beam $L_1$ is incident upon vertical deflecting mirror 132, deflected horizontally at steerable mirror 134, and through beam expanding Galilean telescope having small negative lens 136 and large motorized positive lens 138. Vertical deflection to a combined beam path occurs at vertical deflecting mirror 140.

Likewise, coherent light beam $L_2$ is incident upon vertical deflecting mirror 142, deflected horizontally at steerable mirror 144, and through beam expanding Galilean telescope having small negative lens 146 and large motorized positive lens 148. Vertical deflection to a combined beam path occurs at vertical deflecting mirror 150.

Presuming that the beams are parallel, both parallel beams are deflected at fractional beam splitter 160 with the main energy input of coherent light beams $L_1$–$L_2$ eventually to steerable mirror 30. Thus presuming that coherent light beams $L_1$–$L_2$ are precisely parallel, scanning table S will be fully capable of assuring parallel transport of the resulting beams.

Referring further to FIG. 8, fractional beam splitter 160 diverts a small fraction of coherent light beams $L_1$–$L_2$ to horizontal analysis cell mirror 162, through beam analysis beam splitter 166, beam focus beam splitter 164, to beam pointer deflecting mirror 168. Light is deflected through Fresnel focusing plate 170 to quad detector $Q_1$.

Coherent light beams $L_1$–$L_2$ alternate in their respective pulses. Quad detector $Q_1$ is switched; driving steerable mirror 134 when coherent light beam $L_1$ is active and driving steerable mirror 144 when coherent light beam $L_2$ is active. Simple adjustment thus assures that when coherent light beams $L_{1-2}$ are incident upon fractional beam splitter 160, the respective paired beams are precisely parallel. When the beams are precisely parallel, incident parallel transport will be assured at scanning table S.

Table T and its function of maintaining the substrate in position for ablation can now be set forth. Table T is located immediately below mask M. It functions to permit intermittent advance of polyimide P in direction 137 and to clamp polyimide P during ablation of a matrix of vias.

Figure 9A:
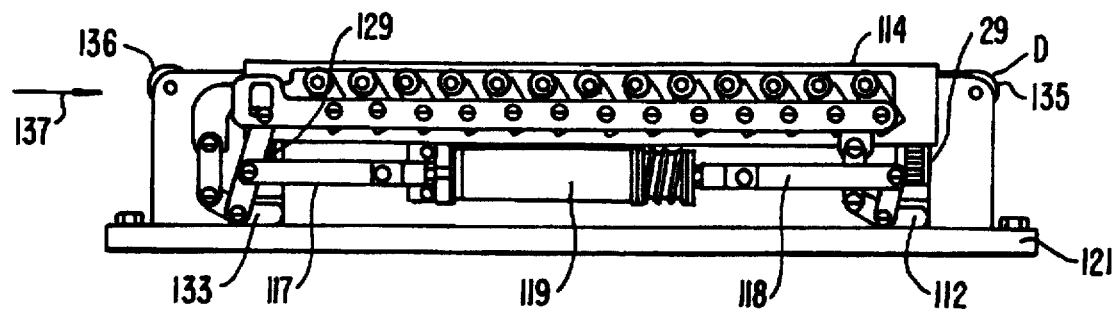
FIGS. 9A, 9B and 9C are respective side elevation and two end elevation views of the assembled table; and, FIG. 10 is an exploded view of the table of this invention for identifying the discrete parts of this invention and setting forth their operative interconnection.
Figure 9C:
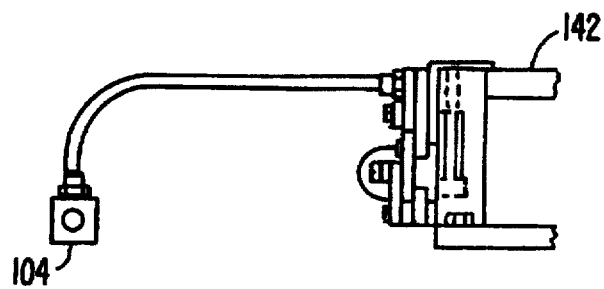
Figure 9B:
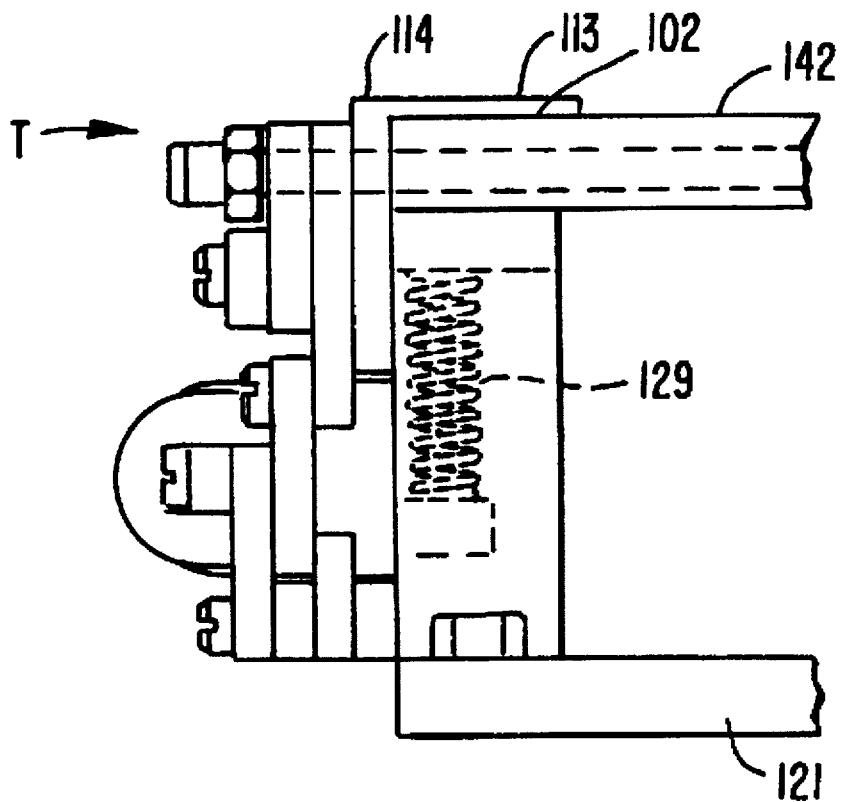
Figure 10:
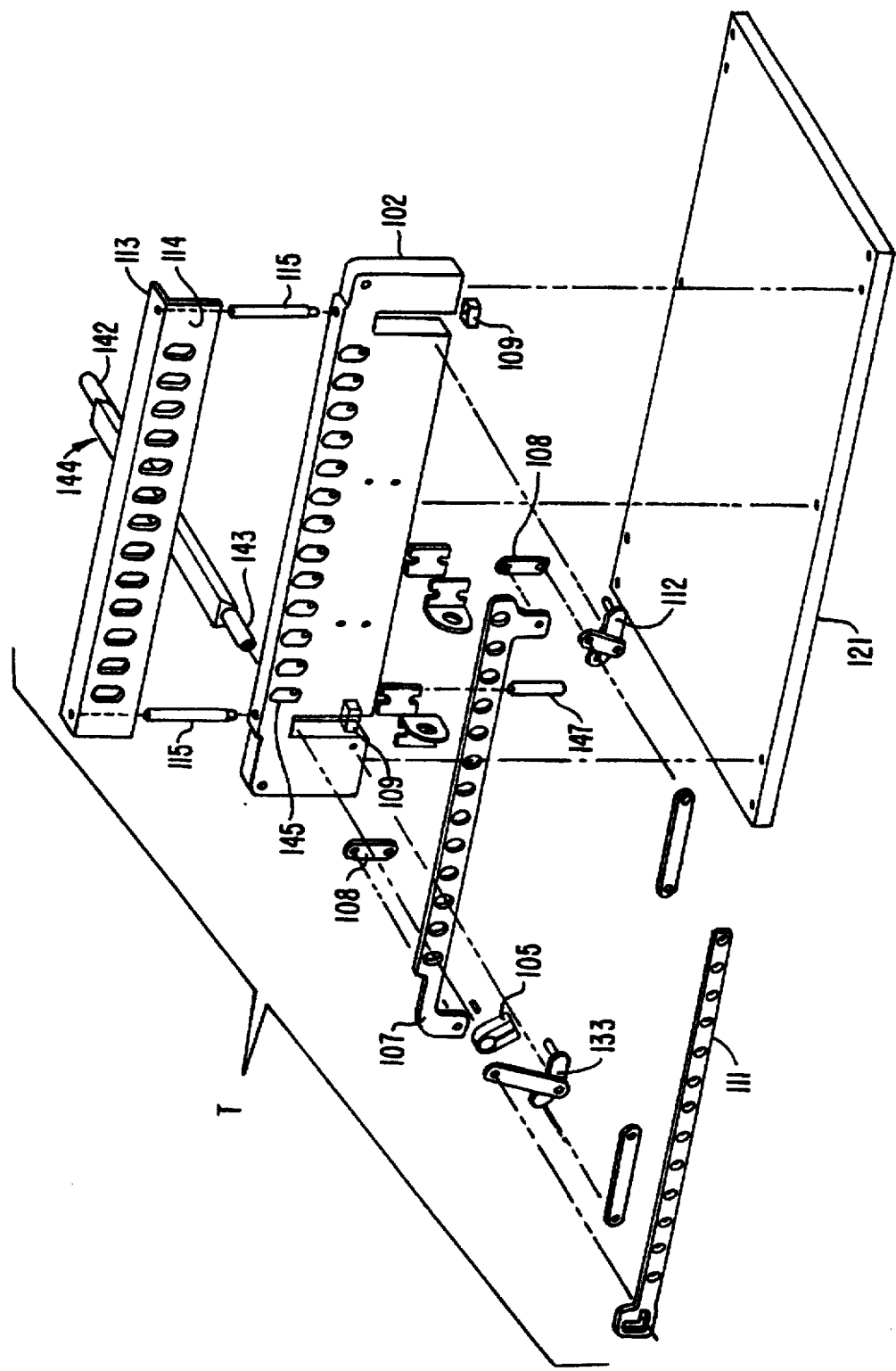

Referring to FIGS. 9A, 9B, and 10, table T of this invention can be understood with respect to its main operational portions.

Polyimide P passes over front end roller 135 at the lead edge of table T and rear end roller 136 at the trailing edge of table T. These respective rollers serve to flatten polyimide P at the point of passage of the polyimide over the rollers.

At the side edges, polyimide P is threaded over the top of paired support rails 102. The top of these support rails 102, front end roller 135, and rear end roller 136 establish the distance of polyimide P from mask M for the ablation of vias.

Table T includes thirteen support/cooling tubes 142 that provide 94% of the support of polyimide P as it passes over table T between front end roller 135 and rear end roller 136. These support/cooling tubes 142 are fabricated from aluminum alloy and have water constantly circulated through from manifolds 104 on either side. (See FIG. 9C).

Referring to FIG. 10, support/cooling tubes 142 are independently sprung on each end. The respective support/cooling tubes 142 fit at rounded ends 143 in elongate slots 145. Tube carrier 107 and front and rear tube carrier links 108 together with cooling tube springs 147 cause support/cooling tubes 142 to be biased upwardly against edge 113 of web edge clamp 114.

It will be observed that each of support/cooling tubes 142 includes flat surface 144. Flat surface 144 includes several functions. First, when the respective flat surface 144 of all tubes are registered one to another, a support surface is defined which supports approximate 94% of the surface of the material being ablated. Second, when support/cooling tubes 142 are rotated, flat surface 144 is able to dump debris created during ablation. Absence of this debris enables following ablations to occur without either scratching or interference in substrate elevation from the accumulated debris. Finally, this surface enables the heat of ablation to be conducted to the tubes which in turn are water cooled.

Clamping of polyimide P to support rail 102 occurs through web edge clamp 114. Web edge clamp 114 has edge 113 which overhangs and extends beyond support rail 102. Edge clamp spring 129 urges web edge clamp 114 down onto support rail 102 to clamp the substrate. Edge clamp blocks 109 serve to coact with front bell crank 112 and rear bell crank 133. Support/cooling tubes 142 are thus free to seek their own level against the bottom of the overhanging edge of the web edge clamp (see 9B) ensuring accurate location in relation to the web and the edge clamp. Web edge clamp 114 un-clamps at the end of the opening cycle and clamps at the beginning of the close cycle. Web edge clamp 114 acts vertically with no lateral or longitudinal disturbance of the web.

As has been made clear, it is necessary to rotate support/cooling tubes 142. Rotation link 111 acting through cooling tube clamps 105 causes support/cooling tubes 142 to rotate 60° during opening cycle, dumping any ablation debris into a pan (not shown) located between the support rails.

Calibration shims are located below the support plate 121. When the calibration shim is removed, the entire assembly is lowered and the calibration plate placed on top of the edge clamps.

Operation of table T has been fully described in copending patent application Ser. No. 08/536,748 filed simultaneously herewith on Sep. 29, 1995 and incorporated herein by reference, entitled Apparatus and Process for Holding Flexible Substrate, now pending.

In this reference the function of cylinder link 117, cylinder link 118, and pneumatic cylinder 119 together with front bell crank 112 and rear bell cranks 133 actuates a mechanical sequence of clamp, supporting, releasing, and debris dumping as ablation sequentially occurs. This application is incorporated by reference herein; detailed sequential operation of the apparatus will not be repeated here. However, this reference is incorporated by reference as if fully set forth herein.

What is claimed is:

1. A process for ablating a matrix of high density vias in a substrate comprising the steps of:

providing a continuous flexible substrate;

providing a mask having subapertures, which subapertures when scanned produce at a working distance from the mask an array of working images for ablating a corresponding array of vias in the substrate;

providing a table for registering the substrate at the working distance from the mask;

incrementally advancing and stopping the continuous flexible substrate over the table;

providing a vacuum over the table and substrate;

scanning the mask with coherent light to ablate the substrate over the table when the substrate is stopped to ablate the matrix of vias in the substrate in a vacuum; and, while maintaining the vacuum, removing debris from the table after the ablating step.

2. A process for ablating a matrix of high density vias in a substrate according to claim 1 and wherein the step of:

providing a continuous flexible substrate includes incrementally advancing a continuous flexible substrate from a supply roll to a take up roll.

3. A process for ablating a matrix of high density vias in a substrate according to claim 1 and wherein the step of:

removing debris from the table after the ablating step includes providing the table with a plurality of flat surface members; and, tilting the flat surface members after each ablation to discharge debris on the table.

4. A process for ablating a matrix of high density vias in a substrate according to claim 1 and including the step of: cooling the table.

5. A process for ablating a matrix of high density vias in a substrate according to claim 1 and wherein the step of:

scanning the mask with coherent light includes scanning the mask with two beams of coherent light.

6. A process for ablating a matrix of high density vias in a substrate according to claim 5 and wherein the step of:

scanning the mask with coherent light includes alternating the two beams of coherent light.

* * * * *